United States Patent
De Fazio et al.

(10) Patent No.: US 7,372,313 B2
(45) Date of Patent: May 13, 2008

(54) VARIABLE IMPEDANCE CIRCUIT AND APPARATUS COMPRISING SAID VARIABLE IMPEDANCE CIRCUIT

(75) Inventors: Michele De Fazio, Ceglie Massapico (IT); Felice Alberto Torrisi, Carlentini (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/485,630

(22) Filed: Jul. 11, 2006

(65) Prior Publication Data
US 2007/0018709 A1  Jan. 25, 2007

(30) Foreign Application Priority Data
Jul. 12, 2005  (IT) .......................... MI2005A1318

(51) Int. Cl.
*H03L 5/00* (2006.01)
(52) U.S. Cl. .................................... 327/308; 333/81 R
(58) Field of Classification Search ............... 327/306, 327/308; 333/81 R
See application file for complete search history.

(56) References Cited

U.S. PATENT DOCUMENTS

| | | | | |
|---|---|---|---|---|
| 6,006,169 A | * | 12/1999 | Sandhu et al. | 702/132 |
| 6,448,815 B1 | * | 9/2002 | Talbot et al. | 326/86 |
| 6,545,560 B1 | * | 4/2003 | Thompson et al. | 333/17.3 |

FOREIGN PATENT DOCUMENTS

WO   03/021777   3/2003

* cited by examiner

*Primary Examiner*—Dinh T. Le
(74) *Attorney, Agent, or Firm*—Lisa K. Jorgenson; Robert Iannucci; Seed IP Law Group PLLC

(57) ABSTRACT

A variable impedance circuit includes at least one fixed resistance and a plurality of transistors between a first and a second terminal. The transistors belonging to the plurality of transistors are arranged parallel to one another and parallel to the resistance and are controllable by a plurality of control signals different from one another and configured in such a way as to obtain a total impedance between said first and second terminals that is substantially variable in a continuous manner.

23 Claims, 3 Drawing Sheets

VARIABLE IMPEDANCE CIRCUIT AND APPARATUS COMPRISING SAID VARIABLE IMPEDANCE CIRCUIT

BACKGROUND OF THE INVENTION

1. Field of the Invention

The present invention relates to a variable impedance circuit and apparatus comprising said variable impedance circuit.

2. Description of the Related Art

Resistive circuits are generally known in which resistance varies linearly; said circuits are, for example, used in devices provided with amplifiers in which it is necessary to obtain a linearly variable gain.

The simplest way to obtain an impedance that varies linearly is to use an MOS transistor operating in a triode zone; nevertheless, if a wide impedance variation is necessary it is not possible to use a simple MOS transistor.

A circuit that enables a wide resistance variation to be obtained is available with the circuit in FIG. 1. In said circuit a resistor Rp is arranged between an input voltage Vinn and ground GND and the terminals thereof are connected to the drain and source terminals of a NMOS transistor M1p having the gate terminal connected to a voltage Vconn. The value of the resistance of the entire circuit increases when the voltage between gate and source of the transistor M1p decreases, i.e. when the transistor moves away from the triode region of operation. This latter situation gives rise to a total non-linear resistance as the resistance of MOS transistor M1p, which in this case is the predominant resistance, varies in a non-linear manner due to the passage of the transistor from the triode region of operation to the saturation region of operation during the swing of the signal Vinn. When on the other hand the resistance of the resistor Rp is predominant, total resistance becomes linear.

Another circuit that enables wide resistance variation to be obtained is the resistor with controlled voltage of patent WO 03/021777. Said resistor comprises an input gate and an output gate and at least two circuit blocks arranged between said two gates. A circuit block has a first impedance that is variable and controllable by means of a first signal and the second circuit block has a second impedance that is variable and controllable by means of a second signal; the two impedances can be controlled in an independent manner. Total impedance is arranged so as to be variable in a continuous manner within a given variation field of the values of the control signals.

BRIEF SUMMARY OF THE INVENTION

One embodiment of the present invention provides a variable impedance circuit that enables both a wide impedance variation and a continuously variable impedance to be obtained.

One embodiment of the present invention is a variable impedance circuit comprising at least one fixed resistance and a plurality of transistors, a first and a second terminal, wherein the transistors belonging to said plurality of transistors are arranged parallel to one another and parallel to said resistance and are controllable by a plurality of control signals that are different from one another and are configured in such a way as to obtain a total impedance between said first and second terminal of the circuit that is substantially variable in a continuous manner.

BRIEF DESCRIPTION OF THE SEVERAL VIEWS OF THE DRAWINGS

The characteristics and advantages of the present invention will be made more evident from the following detailed description of a practical embodiment thereof illustrated as non-limiting example in the enclosing drawings, in which.

DETAILED DESCRIPTION OF THE INVENTION

Figure 2:
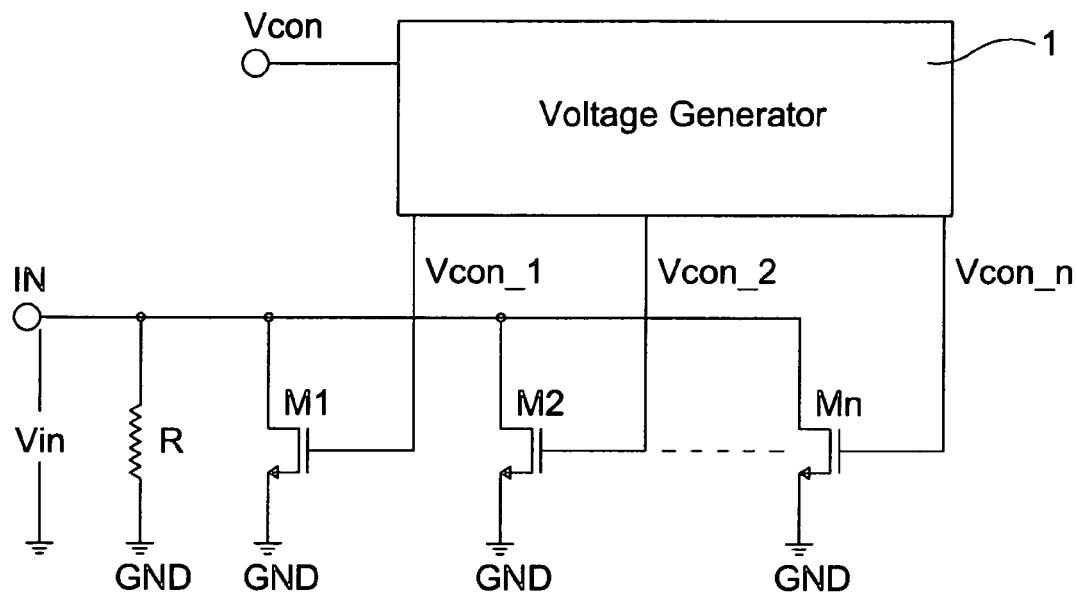
FIG. 2 is a variable impedance circuit diagram according to one embodiment of the invention.

With reference to FIG. 2 there is shown a diagram of a variable impedance circuit according to one embodiment of the present invention. Said circuit comprises the parallel of a resistor R and of a plurality of n NMOS transistors M1 ... Mn arranged between a first terminal IN and a second terminal GND, i.e. ground, between which there is an input voltage Vin. The transistors M1 ... Mn have the gate terminals connected to a voltage generator 1; the latter has an input voltage Vcon and is suitable for generating voltage signals Vcon_1 ... Vcon_n for the respective gate terminals of the transistors M1 ... Mn. The generator 1 generates the control voltages Vcon_1 ... Vcon_n that are configured in such a way as to obtain total impedance Ztot between said first and second circuit terminal that is variable in a continuous manner. Preferably, the signal Vcon is a variable signal and increases, for example, between a nil value to the value VH over successive periods of time T1 ... Tn so that at the end of each of the periods of time T1 ... Tn−1 it assumes increasing intermediate values Vh1, Vh2 ... Vhn−1. Preferably, the voltages Vcon_1 .... Vcon_n grow in succession one after the other from the nil value to the value VH, over various periods of time T1 ... Tn corresponding to the successive periods of growth time of the signal Vcon from 0, Vh1, Vh2 ... VH; once the voltages Vcon_1 ... Vcon_n reach the value VH they maintain it over subsequent periods of time. Preferably, the periods of time T1 ... Tn are equal to a period of time T, and the voltages Vcon_1 ... Vcon_n grow in a ramp form for the duration of the period T and retain the value VH over the subsequent periods of time T, as shown for example in the time diagrams of FIG. 3 only for the voltages Vcon_1 ... Vcon_3; preferably the voltage Vcon_1 starts to grow after a delay Td that corresponds to a variation Vd of the signal Vcon. The transistors M1 ... Mn have dimensions growing from M1 to Mn.

For small voltage values Vcon_1, the transistor M1 is switched off and therefore the impedance Ztot viewed at the heads of the terminals IN and GND is R, i.e. there is a continuous, i.e. linear type of resistance.

When Vcon_1 starts to grow, the resistance of the transistor M1 decreases and becomes non-linear; nevertheless, as said resistance is greater than the resistance R, the impedance Ztot will still increase in a continuous manner and will be provided by the resistor R. When the voltage Vcon_1 increases in such a way that the transistor M1 enters the triode region of operation, the resistance connected to it becomes linear and the value thereof becomes smaller than the value of the resistance R; total impedance Ztot seen between the terminals IN and GND is still of the continuous type. The other MOS transistors are switched off.

When Vcon_2 starts to grow, the resistance of the transistor M2 decreases and becomes non-linear; nevertheless, as said resistance is greater than the switch-on resistance of the transistor M1, total impedance Ztot will still be of continuous type. When the voltage Vcon_2 grows in such a way that the transistor M2 enters the triode region of operation, the resistance connected thereto becomes linear and the value thereof becomes smaller than the value of the switch-on resistance of the transistor M1; total impedance Ztot seen between the terminals IN and GND is still of continuous type. The other MOS transistors M3. Mn are switched off.

The transistors M3 . . . Mn will switch on in the manner already disclosed for the transistors M1 and M2. When all the transistors M1 . . . Mn have come on total impedance will be given approximately by the resistance connected to the transistor Mn.

Preferably, the transistors M1 . . . Mn are sized in such a way that the widths W1 . . . Wn of the gates of the MOS transistors M1 . . . Mn are such that the ratio between a general width Wk and the preceding width Wk−1 is the same as the ratio between the subsequent Wk+1 and the width Wk and the lengths Lk are all equal.

Figure 3:
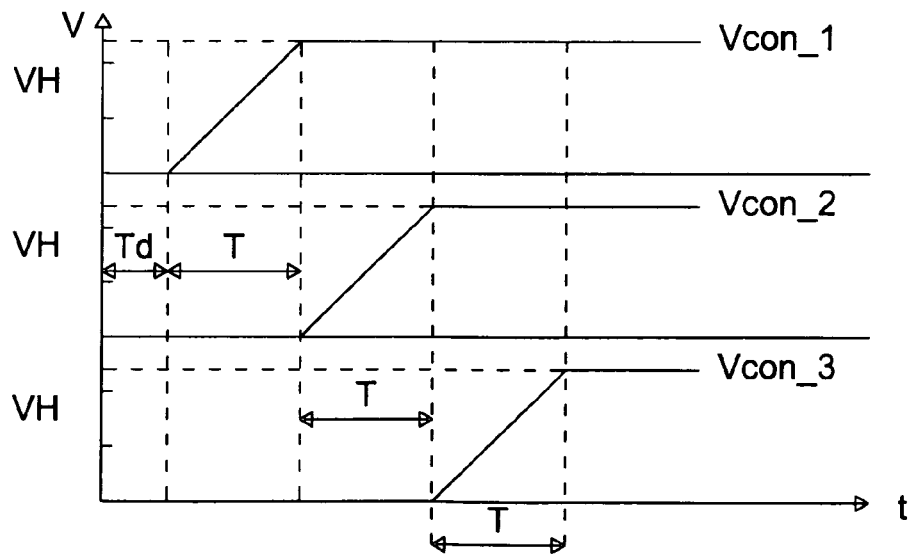
FIG. 3 is a diagram of the control voltage used in the circuit in FIG. 2.
Figure 4:
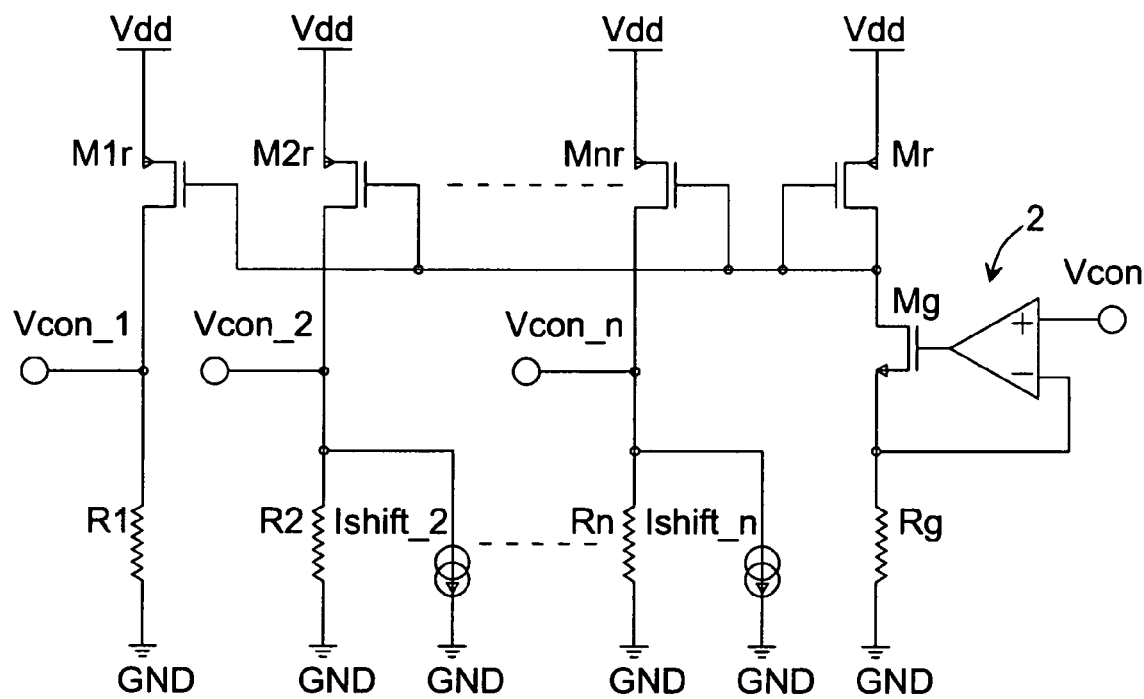
FIG. 4 shows a circuit implementation of the circuit voltage generator of FIG. 2.

A possible embodiment of the voltage generator 1 of the circuit in FIG. 2 is shown in FIG. 4. The circuit in FIG. 4 comprises a device 2 constituted by an operational amplifier having the non-inverting input connected to the voltage Vcon, the output terminal connected to the gate terminal of a transistor Mg, the source terminal of the transistor Mg connected to the inverting input and to the resistance Rg connected in turn to ground GND. The drain terminal of the transistor Mg is connected with the drain terminal and the gate terminal of a transistor Mr, having a gate width Wo, and with the gate terminals of the transistors M1r . . . Mnr; said transistors have the source terminal connected to the supply voltage Vdd and have respective widths W1 . . . Wn. The drain terminal of the transistor M1r is connected to a resistance R1 connected to ground whilst the drain terminals of the transistors M2r . . . Mnr are connected respectively to the resistances R2 . . . Rn connected to ground and to the current generators Ishift_2 . . . Ishift_n connected to ground. The voltage Vcon is transformed into current by means of the resistance Rg and is then mirrored in the resistors R1 . . . Rn to obtain the control voltages Vcon_1 . . . Vcon_n. The resistances R1 . . . Rn have the same value and a good value for a general k-th current generator is provided by Ishift_k=(k−1)Vdd/Rk. The voltages Vcon_1 . . . Vcon_n, like those shown in FIG. 3, are obtainable by means of a ratio of the gate widths Wk/Wo=P, with k variable between 1 and n and with P greater than or the same as n.

Figure 1:
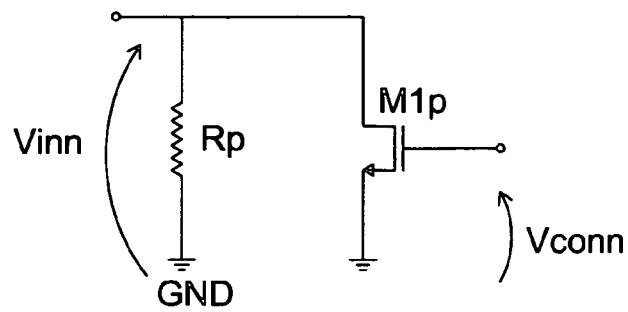
FIG. 1 is a variable impedance circuit diagram according to the prior art.
Figure 5A:
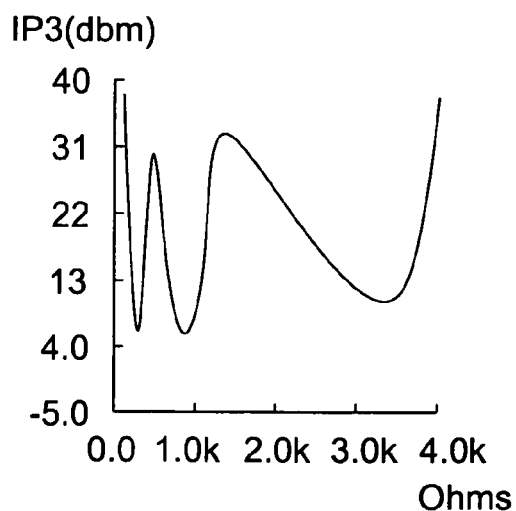
FIGS. 5a and 5b show diagrams of the variation of the parameter IP3 in function of the total resistance of the circuit in FIG. 2 with the use of three or five MOS transistors.
Figure 5B:
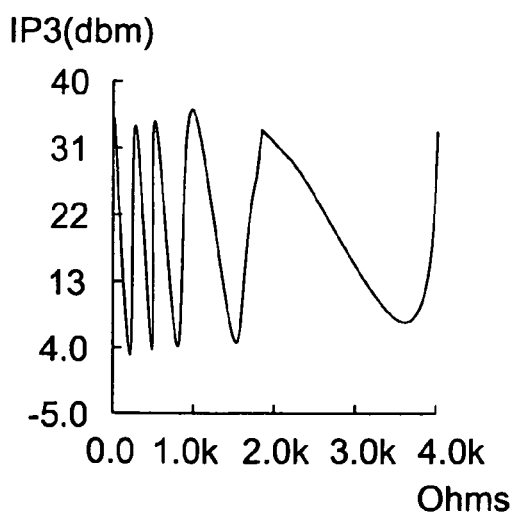

FIGS. 5a and 5b show the results of the simulations of the output value IP3, i.e. the third-order intercept, for the circuit in FIG. 2 if three and five MOS transistors are used. For different values of the control voltages of the MOS transistors we obtain different values of the output resistance shown on the X axis and different values of the parameter IP3 shown on the Y axis. The trend of the parameter IP3 has minimum values that are higher in the case of use with a single MOS transistor, as in the circuit in FIG. 1.

Figure 6:
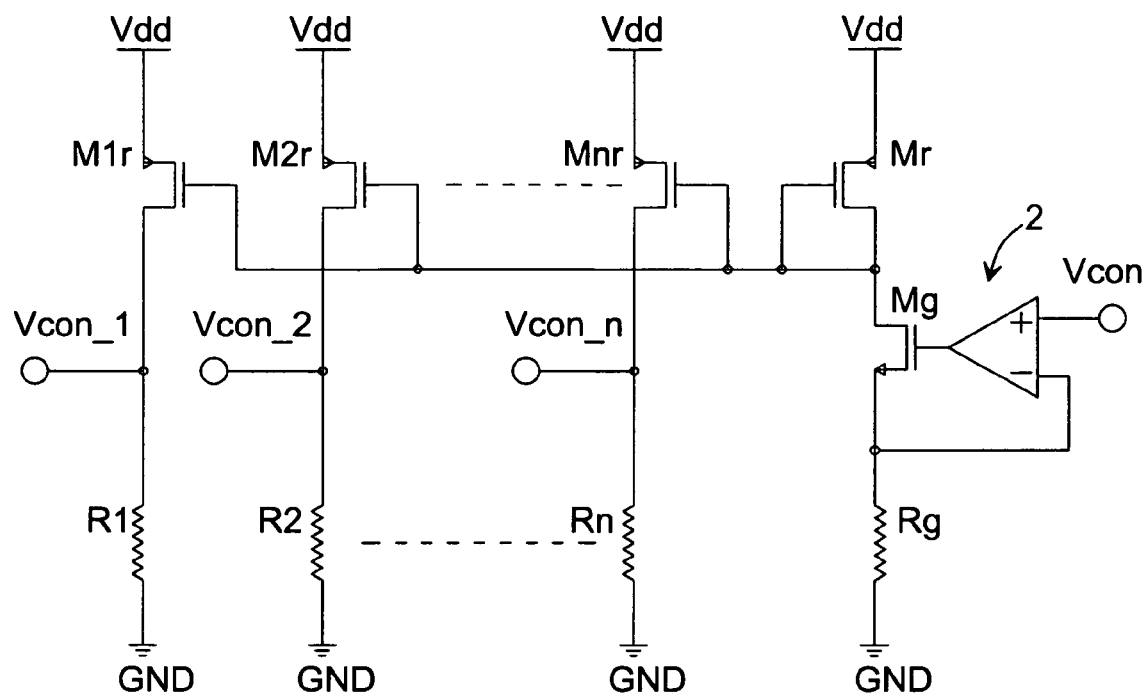
FIG. 6 shows another circuit implementation of the voltage generator of the circuit in FIG. 2.
Figure 7:
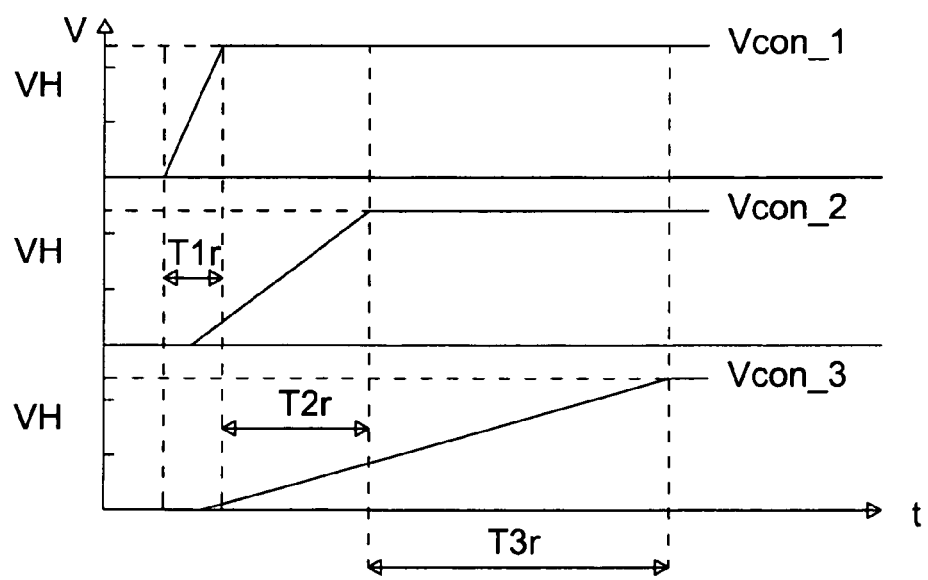
FIG. 7 is a diagram of the control voltages deriving from the voltage generator in FIG. 6.

Another possible embodiment of a voltage generator of the circuit in FIG. 2 is shown in FIG. 6. With respect to the circuit of FIG. 4 there are no current generators Ishift_2 . . . Ishift_n and a ratio of the widths of gate Wk/Wo is used with k variable between 1 and n, variable in such a way as to obtain the control voltages Vcon_1 . . . Vcon_n as shown in FIG. 7 with n=3; i.e. because the control voltages Vcon_1 . . . Vcon_n have to reach the value of the threshold voltage to change in a considerable manner the impedance value of the controlled MOS transistor. The voltages Vcon_1-Vcon_3 are similar to those in FIG. 3 but the periods of time T1r-T3r in which the voltage increases from the value 0 to the value VH are different for the voltages Vcon_1-Vcon_3.

It is also possible to implement the circuit in FIG. 2 with PMOS transistors instead of NMOS transistors and in which the terminals connected to ground GND are replaced with terminals connected to the supply voltage Vdd, the terminals connected to the supply voltage Vdd are replaced with terminals connected to ground GND and where the control voltage Vcon decreases to reach a low value VL.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A variable impedance circuit, comprising:
 a fixed resistance connected between first and second terminals;
 a plurality of transistors arranged parallel to one another and parallel to said resistance; and
 controlling means for controlling the transistors using a plurality of control signals that are different from one another and configured in such a way as to obtain a total impedance between said first and second terminals that is substantially variable in a continuous manner, wherein said control signals of said plurality of control signals increase as ramp waveforms from a substantially nil value to a reference value, the ramp waveforms each having a different slope from one another.

2. The circuit according to claim 1, wherein each of said control signals reaches the reference value at times that are different from one another.

3. The circuit according to claim 1 wherein said controlling means are also for maintaining said control signals of said plurality of control signals at said reference value once said reference value is reached.

4. The circuit according to claim 1, wherein said plurality of transistors is a plurality of MOS transistors.

5. The circuit according to claim 4 wherein said MOS transistors of said plurality have increasing dimensions from a first transistor to a last transistor of said plurality.

6. The circuit according to claim 5, wherein a ratio between a width of a gate of a general MOS transistor of the plurality and a width of a gate of a preceding MOS transistor of the plurality is the same as a ratio between a width of a gate of a subsequent MOS transistor of the plurality and the width of the gate of said general MOS transistor.

7. The circuit according to claim 1 wherein the controlling means include a generator of the plurality of control signals.

8. The circuit according to claim 7, wherein said generator has an input voltage that is variable from an initial value to the reference value.

9. The circuit according to claim 8, wherein the generator comprises:
a device suitable for transforming said variable input voltage into a current;
a plurality of resistances; and
another plurality of transistors suitable for mirroring said current into the plurality of resistances to obtain said plurality of control signals.

10. The circuit according to claim 9, wherein the transistors of the another plurality are MOS transistors, and a ratio between a width of a gate of a first one of the MOS transistors of said another plurality and a width of a gate of other transistors of said another plurality is variable.

11. The circuit according to claim 9, wherein the generator comprises a plurality of current generators that are different from one another and are connected parallel to said plurality of resistances, respectively, and a ratio between a width of a gate of a first one of the MOS transistors of said another plurality and a width of a gate of other transistors of said another plurality is constant.

12. A variable impedance circuit, comprising:
a resistance connected between first and second terminals;
a plurality of transistors arranged parallel to one another and parallel to the resistance; and
a voltage control circuit having a plurality of output terminals connected respectively to respective control terminals of the plurality of transistors, the control circuit being structured to output a plurality of control signals that each increase from a first value to a second value, the control signals attaining the second value at different time instances, wherein the control circuit comprises:
a current mirror having a primary leg through which a primary current flows and a plurality of secondary legs, each secondary leg including a resistance at which a respective one of the control signals is produced.

13. The circuit according to claim 12, wherein the control signals each increase according to a ramp waveform.

14. The circuit according to claim 12, wherein the control signals are increasing at the same time instant and the control signals increase at different rates.

15. The circuit according to claim 12, wherein the control signals begin increasing from the first value at different time instances and the control signals increase at the same rate.

16. The circuit according to claim 12 wherein the transistors of the plurality of transistors have increasing dimensions from a first transistor to a last transistor of the plurality.

17. The circuit according to claim 12, wherein a plurality of the plurality of secondary legs include respective current generators that are different from one another, each current generator being connected parallel to the resistance of the secondary leg in which the current generator is included.

18. A method of controlling a variable impedance circuit that includes a resistance connected between first and second terminals, and a plurality of transistors arranged parallel to one another and parallel to the resistance, the method comprising:
controlling a first one of the transistors with a first control signal that increases from a first value to a second value, the first control signal attaining the second value at a first time instance; and
controlling a second one of the transistors with a second control signal that increases from the first value to the second value, the second control signal attaining the second value at a second time instance that is after the first time instances, wherein the control signals are increasing at the same time instant and the control signals increase at different rates.

19. The method according to claim 18, wherein the control signals each grow with a ramp waveform.

20. The circuit according to claim 18, wherein the second control signal begins increasing from the first value when the second control signal attains the second value and the control signals increase at substantially the same rate.

21. A variable impedance circuit, comprising:
a fixed resistance connected between first and second terminals;
a plurality of transistors arranged parallel to one another and parallel to said resistance; and
controlling means for controlling the transistors using a plurality of control signals that are different from one another and configured in such a way as to obtain a total impedance between said first and second terminals that is substantially variable in a continuous manner, wherein the controlling means include a generator of the plurality of control signals, wherein said generator has an input voltage that is variable from an initial value to the reference value, wherein the generator comprises:
a device suitable for transforming said variable input voltage into a current;
a plurality of resistances; and
another plurality of transistors suitable for mirroring said current into the plurality of resistances to obtain said plurality of control signals.

22. The circuit according to claim 21, wherein the transistors of the another plurality are MOS transistors, and a ratio between a width of a gate of a first one of the MOS transistors of said another plurality and a width of a gate of other transistors of said another plurality is variable.

23. The circuit according to claim 21, wherein the generator comprises a plurality of current generators that are different from one another and are connected parallel to said plurality of resistances, respectively, and a ratio between a width of a gate of a first one of the MOS transistors of said another plurality and a width of a gate of other transistors of said another plurality is constant.

* * * * *